United States Patent [19]

Chau

[11] Patent Number: 5,682,123

[45] Date of Patent: Oct. 28, 1997

[54] VOLTAGE CONTROLLED RING OSCILLATOR HAVING LEVEL TRANSLATOR IN OUTPUT

[75] Inventor: Raymond Chau, Toronto, Canada

[73] Assignee: ATI Technologies Inc., Thornhill, Canada

[21] Appl. No.: 366,922

[22] Filed: Dec. 30, 1994

[51] Int. Cl.[6] .................................................. H03B 5/02
[52] U.S. Cl. ............................................. 331/57; 331/74
[58] Field of Search ........................................ 331/57, 74

[56] References Cited

U.S. PATENT DOCUMENTS 5,262,735  11/1993  Hashimoto et al. .................. 331/74

Primary Examiner—Siegfried H. Grimm
Attorney, Agent, or Firm—Pascal & Associates

[57] ABSTRACT

A voltage controlled oscillator comprised of a current controlled oscillator formed of a loop of serially connected inverters, the oscillator having a primary output at an output of one of the inverters for providing a primary pulse signal and a secondary output at the output of another inverter spaced from the one inverter by an odd number of inverters for providing a secondary pulse signal which is in antiphase to the primary pulse signal, apparatus for receiving the primary and secondary pulse signals and for providing an output signal which indicates the presence of a rising or falling edge to a corresponding primary or secondary pulse signal during a transmission time delay provided by the odd number of inverters.

9 Claims, 2 Drawing Sheets

VOLTAGE CONTROLLED RING OSCILLATOR HAVING LEVEL TRANSLATOR IN OUTPUT

FIELD OF THE INVENTION

This invention relates to the field of electronic oscillators and in particular to a voltage controlled oscillator.

BACKGROUND TO THE INVENTION

A class of voltage controlled oscillators (VCOs) utilizes a voltage controlled oscillator formed of a ring of inverters comprised of field effect transistors (FETs). To reduce the size of the PLLs smaller geometry FETs with increasing densities have been used, which presents a problem of dissipating heat. One way to reduce the amount of heat that needs to be dissipated is to reduce the supply voltage; a previous standard supply voltage of 5 volts has been giving way to a new standard of 3.3 volts.

However the lower supply voltage is often shared by analog circuits, for reasons of system cost and reliability. The common voltage supply provides a possible noise coupling path. The interfering effects become proportionately larger as the PLL output voltage swing becomes smaller due to the reduced supply voltage.

One form of prior art oscillator changes the nature of the VCO to a current starved inverter (CSI) element, by connecting a resistor in series with each inverter to each pole of the power supply, as shown in FIGS. 1A and 1B. FIG. 1A illustrates an inverter, comprised of an n-channel FET 1 and a p-channel FET 3 with their gates connected together to an input 5 and the drain of FET 1 connected to the source of FET 3 and to an output 7, with the drain of FET 3 connected to a positive supply rail through a resistor 9 and the source of FET 1 connected to the negative supply rail through a resistor 11.

Alternatively, as shown in FIG. 1B the drain of FET 1 is connected to the source of FET 3 via resistors 9 and 11. The source of FET 1 is connected to the negative supply rail and the drain of FET 3 is connected to the positive supply rail.

The resistance R of either resistor 11 is dependent on the control voltage (i.e. $R=f(aVc)$, where a is a constant of proportionality).

The presence of the resistors degrades the drive of the inverting stage and hence the delay and frequency of oscillation.

Each of the above circuits becomes a so-called current starved inverter (CSI). The output voltage swings of either inverter can be at any level between the positive and negative voltage supply. Changes in frequency of the PLL arise from changes in current drive of each inverter as a result of change to the transconductance caused by change in the control voltage level altering the operating points of the FETs of each inverter.

However there are several disadvantages to the above-described scheme. Current drive, and hence frequency due to the linear relation between them, is dependent on the full output voltage swing. This is set by the integrated circuit chip supply voltage which is defined externally at the system level. Unit to unit variation from one system to another can thus affect the characteristics of the CSI based VCO.

Noise coupling in the form of time varying modulation of the supply lines also shows up at the output nodes of the PLL in the form of increased phase jitter or varying oscillator frequency.

The relationship between the control voltage and the transconductance is inherently non-linear for metal oxide silicon (MOS) FETs, resulting in a non-linear change in average inverter output current for a given change in voltage. The previous effect is combined with the given change in voltage. This results in an overall non-linear dependence between frequency and control voltage input.

In the alternate ICO based implementation of a VCO, the average output current in each stage can be controlled by directly controlling the current to the ring of inverters via an FET connected in the negative or positive supply lines to the ICO, as shown in FIGS. 2A, 2B and 2C. FIG. 2A illustrates a ring of inverters 13 having an oscillator output 15. The inverters are powered from a supply source 17 through a control FET such as is shown in FIG. 2B or FIG. 2C.

In the case of the control FET being connected to the positive supply, as shown in FIG. 2B the drain of FET 19 is connected through a resistor 21 to the positive voltage pole of the supply, and the source of FET 19 is connected to the positive supply inputs of each of the inverters as a current source to the ICO. The control input of the ICO is the gate of FET 19, which as a result controls the amount of current supplied to the ring of inverters.

In the case of the control FET being connected to the negative supply, as shown in FIG. 2C the source of FET 19 is connected through a resistor 21 to the negative voltage pole of the supply, and the drain of FET 19 is connected to the negative supply inputs of each of the inverters and forms a current sink for the ICO.

Since the output current is controlled more linearly using the circuits of FIGS. 2A, 2B and 2C, a simpler oscillator results than the "current starved inverter" approach used in the prior art (FIGS. 1A and 1B). This can be realized easily in MOS technology by the use of the degenerating resistors. Further, the voltage to current transformation stage (FET 19 with resistor 21) has inherent noise rejection capabilities which, when combined with an ICO, form a voltage controlled oscillator which is more insensitive to supply variations than the conventional CSI based VCO schemes described with respect to FIGS. 1A and 1B.

Further, the design can be used at conventional supply voltages or with reduced supply voltages with no change in VCO gain. Conventional VCOs described with reference to FIGS. 1A and 1B have outputs that swing between the positive and negative supply rail. As a result the period of the output frequency increases at higher voltage levels due to the additional time required for the outputs to reach the higher levels.

In contrast, in the ICO design, when the supply voltage increases, the additional voltage appears across the transistor 19 (FIGS. 2B and 2C) and thus the voltage, current and frequency in the ICO are maintained constant.

Despite the noise immunity advantages in the ICO design, complications exist in generating an output signal that can swing from the positive supply rail to the negative supply rail. The logic output level from the ICO is a function of the current level and oscillation frequency of the ICO. In the CSI based VCO, the level translators use conventional ratioed MOS inverters connected conventionally to the supply rails, duty cycle variation with frequency results due to the combined effects of varying input logic levels and fixed switching points. This point is typically set around the midpoint of the signal waveform passing around the inverters, so that low logic levels and high logic level would cause an equal and opposite current drive in the output for roughly equal output fall and rise times. In the case of the ICO design, the logic high level will vary, causing variations in the positive duty cycle.

SUMMARY OF THE INVENTION

In the present invention, nearly ideal signal level translation is achieved in the level translator. Further, using the present invention it is possible to obtain a virtually ideal 50% duty cycle square wave output signal, i.e. a square wave with roughly equal rise and fall times, with a maximum level equal to the positive supply rail voltage VDD.

Output signal levels and rise and fall times of the output signals can track those of an ICO using matched topology and FET sizing, while the aforenoted 50% duty cycle can be achieved over all reasonable logic levels and frequency conditions.

More accurate timing of rising and falling edges can be achieved using the present invention, and identically shaped active edges for half and full clock periods can also be achieved.

The above advantages can be realized in accordance with an embodiment of the present invention which is a voltage controlled oscillator comprised of a voltage controlled current source feeding a current controlled oscillator formed of a loop of serially connected inverters, the oscillator having a primary output at an output of one of the inverters for providing a primary pulse signal and a secondary output at the output of another inverter spaced from the one inverter by an odd number of inverters for providing a secondary pulse signal which is in antiphase to the primary pulse signal, apparatus for receiving the primary and secondary pulse signals and for providing an output signal which indicates the presence of a rising or falling edge to a corresponding primary or secondary pulse signal during a transmission time delay provided by said odd number of inverters.

Preferably the receiving apparatus is comprised of a level translator for providing an output pulse signal having a rise or fall time which is substantially constant with changes in frequency control voltage or current applied to the loop or serially controlled inverters.

BRIEF INTRODUCTION TO THE DRAWINGS

A better understanding of the invention will be obtained by reading the description of the invention below, with reference to the following drawings, in which:

FIGS. 1A and 1B are schematic diagrams of single current starved inverter stages that can be used in prior art conventional VCOs, FIG. 2A is a block diagram of an ICO based ring oscillator, FIGS. 2B and 2C are schematic diagrams of positive voltage and ground based voltage to current converters either of which can be used as the current source of FIG. 2A, and FIG. 3 is a partly schematic and partly block diagram of an embodiment of the present invention.

DETAILED DESCRIPTION OF THE INVENTION

Figure 1A:
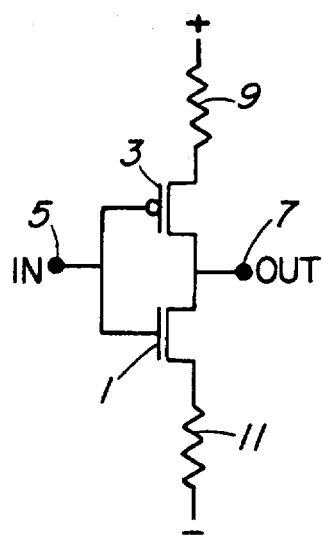
Figure 1B:
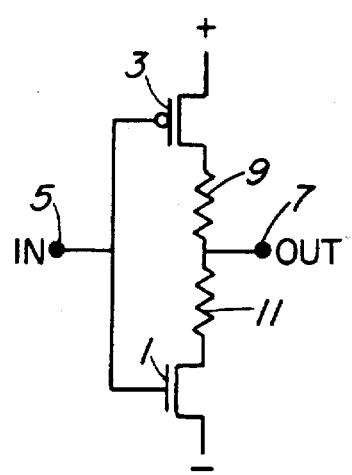
Figure 2A:
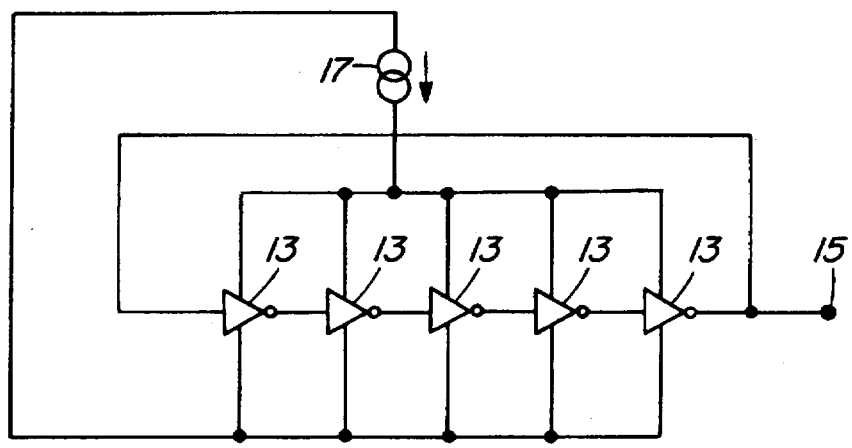
Figure 2B:
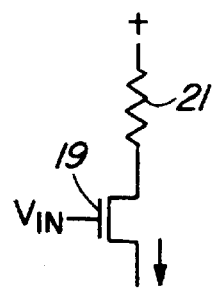
Figure 2C:
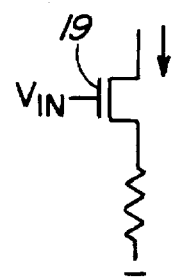
Figure 3:
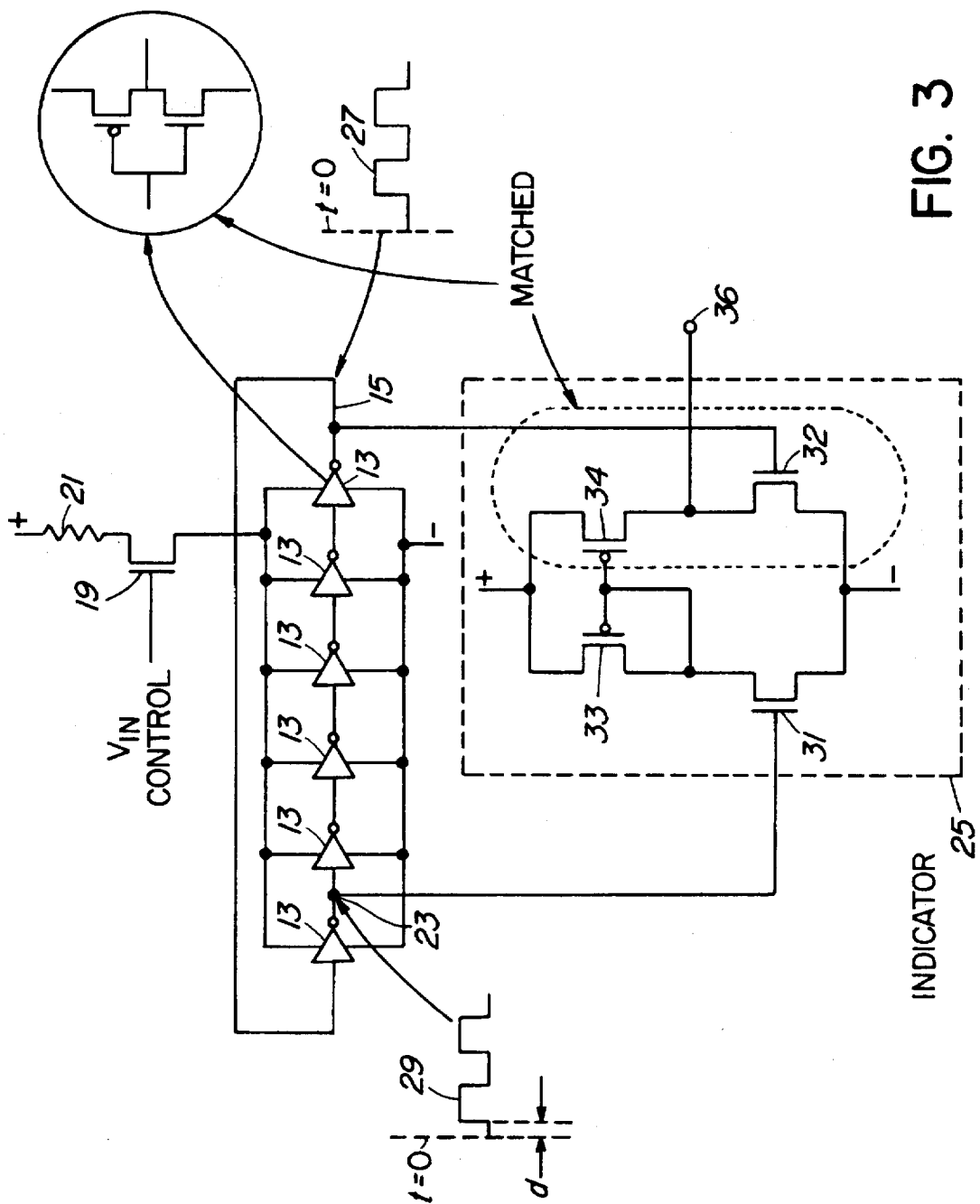

Turning now to FIG. 3, the prior art design described above with respect to FIGS. 2A and 2B is shown modified by defining a secondary output 23 which is spaced an odd number of inverters downstream from the primary output 15, to provide a signal which is in antiphase to the signal at output 15.

A circuit 25 indicates the presence of a rising or falling edge to a corresponding primary or secondary pulse signal appearing at the primary output 15 or at the secondary output 23 during an interval defined by a time delay of the pulse signal traversing the odd number of inverters spacing the two outputs.

The time delay will become evident by a consideration of the pulse signal 27, having a leading falling edge at time t=0, at the output 15. The output signal 29 at output 23 is both phase inverted due to the odd number of inverters and delayed from time t=0 by a delay time d, which represents the delay time of the inverters in series between output 15 and output 23 (a single inverter, in the embodiment shown).

It is preferred that the circuit 25 should be a level translator which provides an output signal which is substantially constant with changes in frequency of the signals input to it resulting from a control voltage applied to the gate of FET 19, or with changes in resulting current applied to the loop of inverters 13.

The level translator illustrated is comprised of a pair of n-channel FETs 31 and 32 with their sources connected together to a negative voltage supply source (ground) and their drains respectively connected to sources of corresponding p channel FETs 33 and 34. The drains of FETs 33 and 34 are connected together and to a positive voltage supply source. The gates of FETs 33 and 34 are connected together and to the source of FET 33. An output terminal 36 is connected to the drain of FET 32. The output 15 is connected to the gate of FET 32 and the output 23 is connected to the gate of FET 31.

FETs 33 and 34 form one embodiment of a a current mirror, with FET 34 mirroring the current carried by FET 33. FETs 31 and 32 should match architecturally to the FET in the inverters of the ICO, being the same size and as similar as possible.

In operation, the rising edges of the pulse signals at outputs 15 and 23 generate both rising and falling output signal edges. The rising edge is fed to FET 32 which generates a sink current and pulls down the output terminal 36. For positive outputs that occur a half cycle later, the rising edge at output 23 is applied to the gate of FET 31, which generates a current that is carried by FET 33, which current is then mirrored by FET 34. This pulls up the output terminal 36 to the level of the common connection of the drains of FETs 33 and 34 (i.e. to VDD). Because FETs 31 and 32 are sized similarly, to the NMOS devices of CMOS inverters in the ring oscillator, the output waveform characteristics will be similar in current levels and output rise times to ring oscillator elements that give rise to them. Thus the level translator has characteristics which are close to the characteristics of an ideal level translator.

The level shifter effectively sets its switching point to the ground (negative) reference, so that variations in the maximum level of the ICO output signal at terminal 15 of the circuit 25 are immaterial as long as the signal swings to the ground reference and swings high enough to turn the FETs on. This is guaranteed by the architectural match of FETs 31 and 32 to the NMOS elements of the CMOS inverters in the ring oscillator.

It may be seen that the rising or falling edges of the pulse signal at the output 15 and the resulting inverted and delayed pulse signal at the output 23 applied to the circuit 25 provide an indicator of the presence of the pulse signal. The time period during which these are indicated is defined by the transmission delay time between output 15 and output 23. The output pulse duty cycle at output 36 is substantially constant with changes in frequency control voltage applied to the gate of FET 19 or of resulting current applied to the ring of inverters 13. The amplitude of the output signal at terminal 36 is defined by the level translator while its timing is defined by the pulse signal generated in the ring of inverters and applied to the gates of FETs 31 and 32.

It will be recognized that the channel types of the FETs can be the reverse of that shown, and for that case the supply voltage polarity will also be reversed from that shown.

The above-described design, a differential output ICO based VCO with a differential level translator provides a simultaneous constant duty cycle output pulse signal at output 36, the output pulse signal having edge rates which are a constant percentage of the clock period. Further, the circuit has inherent noise immunity. These characteristics have not been able to be achieved simultaneously by VCO designs of the prior art.

A person understanding this invention may now conceive of alternative structures and embodiments or variations of the above. All of those which fall within the scope of the claims appended hereto are considered to be part of the present invention.

I claim:

1. A voltage controlled oscillator comprising a current controlled oscillator formed of a loop of serially connected inverters, the oscillator having a primary output at an output of one of the inverters for providing a primary pulse signal and a secondary output at the output of another inverter spaced from the one inverter by an odd number of inverters for providing a secondary pulse signal which is in antiphase to the primary pulse signal, means for receiving the primary and secondary pulse signals and for providing an output signal which indicates the presence of a rising or falling edge to a corresponding primary or secondary pulse signal during a transmission time delay provided by said odd number of inverters.

2. An oscillator as defined in claim 1 in which said odd number of inverters is one.

3. An oscillator as defined in claim 1 in which said receiving means is comprised of a level translator for providing an output pulse signal having a rise or fall time which is a substantially constant percentage of the cycle period with changes in frequency control voltage or current applied to the supply node of a loop of serially controlled inverters.

4. An oscillator as defined in claim 3 in which said level translator is comprised of a pair of voltage control means connected together at a first common terminal in a common source configuration to a reference voltage, one of the voltage control means having a second terminal which can be pulled down to about the voltage level of the reference voltage, means for applying the first and second pulse signals to respective control inputs of the voltage control means, a current mirror connecting the voltage control means to a power supply terminal having a potential difference from that of the reference voltage, the current mirror including a current carrying element and a mirroring element for carrying a current proportional to that of the current carrying element, the mirroring element being connected between the second terminal and the power supply terminal, and means for providing the output pulse signal from the second terminal.

5. An oscillator as defined in claim 3 in which said level translator is comprised of a pair of similar size matched field effect transistors (FETs) having their sources connected together to a reference voltage source, a current mirror including a mirror FET connecting the drains of the FETs to a voltage source of opposite polarity to the reference voltage source, said secondary output connected to the gate of one of the FETs, said primary output connected to the gate of the other of the FETs, and means for providing said output pulse signal from the junction of the mirror FET and one of the pair of the FETs.

6. An oscillator as defined in claim 3 in which said level translator is comprised of a first pair of field effect transistors (FETs) of a first channel conductivity type having their sources connected together and to a first polarity voltage supply, a second pair of FETs of a second channel conductivity type having their drains connected together and to a second polarity voltage supply, the sources of each respective FET of the second pair of FETs being connected to the drain of a corresponding FET of the first pair of FETs, the gates of each of the second pair of FETs being connected together and to the drain of one of the FETs of the first pair of FETs, the gate of said one of the first pair of FETs being connected to said secondary output, the gate of the other of the first pair of FETs being connected to said primary output, and means for providing said output pulse signal from the drain of said other of the first pair of FETs.

7. An oscillator as defined in claim 6 in which the first pair of FETs are architecturally similar, including being the same size.

8. An oscillator as defined in claim 7 in which the first pair of FETs are n-channel conductivity type, and in which the first voltage polarity is negative.

9. An oscillator as defined in claim 7 in which the first pair of FETs are p-channel conductivity type and in which the first voltage polarity is positive.

* * * * *